United States Patent [19]
Houlihan et al.

[11] Patent Number: 6,048,664
[45] Date of Patent: Apr. 11, 2000

[54] ENERGY-SENSITIVE RESIST MATERIAL AND A PROCESS FOR DEVICE FABRICATION USING AN ENERGY-SENSITIVE RESIST MATERIAL

[75] Inventors: Francis M. Houlihan, Millington; Il'Ya L. Rushkin, Bridgewater, both of N.J.

[73] Assignee: Lucent Technologies, Inc., Murray Hill, N.J.

[21] Appl. No.: 09/266,912

[22] Filed: Mar. 12, 1999

[51] Int. Cl.$^7$ .............................. G03F 7/039; G03F 7/30
[52] U.S. Cl. .................. 430/270.1; 430/326; 430/908
[58] Field of Search ............................ 430/270.1, 326, 430/908

[56] References Cited

U.S. PATENT DOCUMENTS

| | | | |
|---|---|---|---|
| 4,996,136 | 2/1991 | Houlihan et al. | 430/313 |
| 5,372,912 | 12/1994 | Allen et al. | 430/270 |
| 5,656,412 | 8/1997 | Chandross et al. | 430/270.1 |
| 5,691,110 | 11/1997 | Bohrer et al. | 430/270.1 |
| 5,725,996 | 3/1998 | Houlihan et al. | 430/322 |
| 5,728,506 | 3/1998 | Kometani | 430/311 |
| 5,756,266 | 5/1998 | Galvin-Donoghue et al. | 430/323 |
| 5,843,624 | 12/1998 | Houlihan et al. | 430/296 |

OTHER PUBLICATIONS

Alicyclic Polymers for 193 nm Resist Applications, Okoroanyanwa, U. et al., Chem.Mater. 10(11), 1998, 3319–3327.
Alicyclic Polymers for 193 nm Resist Applications, Okoroanyanawa, U. et al., Chem. Mater. 10(11), 1998, 3328–3333.

*Primary Examiner*—Janet Baxter
*Assistant Examiner*—Rosemary Ashton
*Attorney, Agent, or Firm*—Dickstein Shapiro Morin & Oshinsky, LLP

[57] ABSTRACT

The present invention is directed to a process for device fabrication and resist materials that are used in the process. The resist material contains a polymer that contains monomeric units that contain alicyclic formate moieties, and at least one other type of monomeric unit. The polymer may be formed by polymerization or by polymer modification of an existing polymer, and the resulting polymer either has alicyclic moieties incorporated into the polymer backbone or pendant to the polymer backbone via saturated hydrocarbon linkages. A preferred polymerization process is free radical polymerization, in which other monomers are selected for polymerization with the alicyclic moiety-containing monomer on the basis of the ability of the monomer to copolymerize by free radical polymerization. Although the polymers are contemplated as useful in resist materials that are sensitive to radiation in the ultraviolet, and x-ray wavelengths as well as sensitive to electron beam radiation, the polymers are particularly advantageous for use in process in which the exposing radiation is 193 nm, because the amount of ethylenic unsaturation in these resist materials is low.

44 Claims, 1 Drawing Sheet

ENERGY-SENSITIVE RESIST MATERIAL AND A PROCESS FOR DEVICE FABRICATION USING AN ENERGY-SENSITIVE RESIST MATERIAL

FIELD OF THE INVENTION

The present invention relates generally to an energy sensitive resist material and a process for device fabrication in which the energy sensitive resist material is used.

BACKGROUND OF THE INVENTION

Lithographic processes are typically employed in the manufacture of devices such as semiconductor devices, integrated optics, and photomasks. Such processes utilize various energy sources to create a relief image in a film of resist material applied onto a substrate. A positive or negative image of the desired device configuration is first introduced into the resist by exposing it to patterned radiation which induces a chemical change in the exposed portions of the resist. This chemical change is exploited to develop a pattern in the resist, which is then transferred into the substrate underlying the resist.

The efficacy of a lithographic process depends at least in part on the resist used to transfer the pattern into the substrate. Certain types of resists offer particular advantages in the context of specific lithographic processes. For example, solution-developed resists are designed to have absorption characteristics appropriate for use at certain exposure wavelengths. It is axiomatic that, if the resist material is opaque to the exposing radiation, the exposing radiation will not be transmitted into the resist material and the desired chemical change will not occur. Therefore it is important to select a resist material that has the appropriate light transmission characteristics at the wavelength of the exposing radiation. Other considerations that drive the selection of an appropriate resist material include the etch resistance of the resist after it has been exposed and developed.

In this regard, resist materials that contain polymers with ethylenic and/or aromatic unsaturation are typically used in lithographic processes for device fabrication in which the wavelength of the exposing radiation is in the traditional ultraviolet (UV) or deep UV range (i.e., about 240 nm to about 370 nm). These resist materials, however, are often not suitable in processes in which the exposing radiation is 193 nm because the carbon-carbon double bond absorbs radiation at this wavelength. Consequently, resist materials typically used for lithographic processes using wavelengths of 248 nm or more are generally not useful in processes using a wavelength of 193 nm. Because lithographic processes for fabricating devices using 0.18 $\mu$m, 0.13 $\mu$m, and smaller design rules are likely to use 193 nm-wavelength light as the exposing radiation, resist polymers that do not contain significant amounts of ethylenic unsaturation are sought.

Certain protective groups, when attached to the polymer, function as moieties that render the polymer relatively insoluble in alkaline (basic) solution. In lithographic processes, these moieties are removed upon irradiation and baking of the polymer film in the presence of a radiation-induced acid, and the polymer then becomes relatively more soluble in alkaline solution. After a substantial percentage of the moieties, for example, t-butyl carbonate, t-butyl ester, or t-butyl ether, have been cleaved from the exposed polymer, the polymer in the exposed region of the film is substantially more soluble in an aqueous alkaline developing solution.

The moieties are not cleaved from polymer in the unexposed regions. Therefore, the resist material in those regions is not as soluble in an alkaline solution. If an alkaline solution is used to develop the image projected onto the resist, the material in the exposed regions is dissolved by developer solution while the material in the unexposed regions is not. It is by this mechanism that a positive tone image is developed that corresponds to the image projected into the resist material.

If light is used as the energy source in a lithographic process, the process is referred to as photolithography. If such photolithographic processes utilize an exposure that occurs simultaneously over an entire device or a number of devices being processed on a substrate, the process utilizes what is considered a blanket exposure. A material, i.e., a resist, which is sensitive to the exposing radiation is coated onto a substrate, e.g., a silicon substrate, on which a plurality of devices will be formed. The coating material may be pre-exposure baked and is subjected to spatially discrete radiation, e.g., light that has been passed through a mask so that the light reaching the resist defines a discrete area. The discrete area defines a pattern that is to be transferred onto the underlying substrate either by negative or positive tone. The coated substrate is, if desired, post-exposure baked prior to image development. The resists used in photolithography are referred to as "photoresists."

A blanket exposure is advantageous because it is relatively fast compared to other methods such as the raster scan technique that is employed when the energy used to expose the resist is a beam of electrons. Generally, however, the resolution that is achieved through a blanket exposure with near ultraviolet or visible light is somewhat poorer than that achieved with other methods such as electron beam lithography.

Improved resolution with a blanket exposure can be achieved by using shorter wavelength light such as deep ultraviolet or X-ray light. One approach to a photoresist sensitive to shorter wavelength radiation employs a photo-acid generator (PAG) that produces an acid moiety upon irradiation with deep ultraviolet light, together with a polymer that reacts under the influence of heat with the generated acid. Such systems are generally referred to as chemical amplification systems because the production of one molecule of acid by radiation (e.g., light) induces a reaction in a plurality of reactive substituents in the acid-sensitive polymer. Because protective groups are not cleaved from the resist polymer in the unexposed regions, it follows that acid is preferably not generated or otherwise present in the unexposed regions.

Attempts have been made to improve the sensitivity and to reduce the fill shrinkage of chemically amplified resists. By improving the sensitivity of resists, less energy is required to create the image throughout the resist layer. In this regard, resist materials that have been partially deprotected have demonstrated enhanced sensitivity. Partial deprotection means that some, but not all, of the protective groups are cleaved from the polymer prior to use of the polymer in a lithographic process.

Although chemically amplified resists show great promise for fine line resolution, these materials have demonstrated a tendency to shrink and crack after the exposure and post-exposure baking steps of the lithographic process. Shrinkage and cracking occur when the protected polymer is heated in the presence of acid, which releases the protecting groups in the form of gaseous products such as $CO_2$ and isobutylene from the polymer. Such shrinkage produces a loss of image quality and, in part, counteracts resolution improvement available through use of deep ultraviolet, X-ray, or electron beam exposure. In device fabrication, because of particularly fine design rules, this film shrinkage can significantly affect the quality of the features produced in the lithographic process. Thus, although chemically amplified resists are extremely promising, some improvement is desirable.

One type of resist material that has been suggested as suitable for 193 nm lithographic processes contains a derivatized acrylate or methacrylate copolymer. While resist materials that contain these copolymers demonstrate adequate sensitivity to 193 nm wavelength radiation, the plasma etch resistance of these copolymers does not meet current processing requirements. Therefore, resist materials that are compatible with 193 nm lithographic processes are desired.

SUMMARY OF THE INVENTION

The present invention is directed to materials for use in lithographic processes, and to the processes themselves, in which an alicyclic formate-containing polymer is incorporated into the resist material. The alicyclic formate-containing polymer has properties which make it particularly suited for use in a lithographic process, and has advantages such as faster photospeed and improved contrast over typically used resists.

In addition, because the formate moieties in the resist film do not undergo acid catalyzed hydrolysis or acidolysis in the exposed area, there is no volume loss associated with the presence of these formate moieties on the polymer. The volume difference between exposed and non-exposed areas of the resist after exposure and bake is caused by moieties that undergo acid-catalyzed hydrolysis or acidolysis. The presence of the formate moieties alleviates stress which may build up in the resist film and adversely affect imaging.

The polymer of the present invention is either the polymerization product of imaging and non-imaging monomers or analogous materials prepared by polymer modification. From this point on we will describe polymer composition in terms of the monomeric units that make up the polymer. Because in a polymer these monomeric units are repeated, these monomeric units are referred to as repeat units. Therefore, according to this definition, a polymer is conceived as consisting of imaging monomeric units and non-imaging monomeric units. It is, however, conceivable that analogous compositions of polymer repeat units could be prepared by polymer modification of an existing polymer instead of polymerizing distinct imaging and non-imaging monomers.

An imaging monomer is defined as a monomer with pendant acidic moieties that can be deprotonated by developer (e.g., acrylic acid, norbornene carboxylic acid) or containing these pendant acidic moieties protected with a functional group capable of acidolysis or hydrolysis (e.g., t-butylacrylate, t-butyl norbornene carboxylate) resulting from photo-generated acid. A non-imaging monomer contains a moiety that has one or more ethylenically unsaturated bonds, and does not contain pendant acidic moieties. The ethylenic functionality of the monomers is either contained as part of a non-cyclic hydrocarbon or as part of a cyclic hydrocarbon or pendant to these moieties.

The copolymer of the present invention contains about twenty-five to about ninety-five mole percent, preferably about fifty to ninety-five mole percent, of total non-imaging monomers, and about five to seventy-five mole percent, preferably about five to fifty mole percent, of one or more imaging monomers. The non-imaging monomers include alicyclic monomers and may include other monomers such as maleic anhydride, maleimides, and non-imaging acrylic or methacrylic monomers. Imaging monomers include monomers such as acrylic acid, methacrylic acid, norbornenecarboxylic acid, t-butyl acrylate, t-butyl methacrylate, or t-butyl nornbornenecarboxylate.

Preferred polymers are a copolymer of norbornenyl formate and norbornene carboxylic acid, a copolymer of norbornenyl formate norbornenecarboxylic acid and t-butyl norbornenecarboxylate, a copolymer of norbornenyl formate, maleic anhydride and acrylic acid, a copolymer of norbornyl formate, maleic anhydride norbornenecarboxylic acid and t-butyl norbornenecarboxylate, and a copolymer of dicyclopentenyl formate and t-butyl norbornenecarboxylate. Copolymers containing carboxylic acid moiety alone are envisaged as being used along with an imageable dissolution inhibitor, while copolymers containing a protected carboxylic acid moiety may be used alone or in the presence of an imageable dissolution inhibitor. An imageable dissolution inhibitor is a dissolution inhibitor having pendent acid moieties or protected acid moieties as previously described.

Additional advantages and features of the present invention will be apparent from the following detailed description and examples which illustrate preferred embodiments of the invention.

DETAILED DESCRIPTION OF PREFERRED EMBODIMENTS

Figure 1:
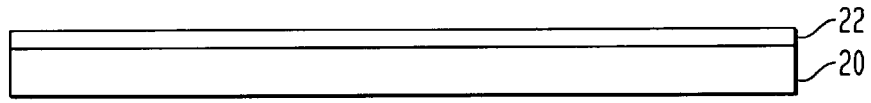
FIG. 1 is a diagrammatic cross-sectional view of a semiconductor wafer undergoing the process of a preferred embodiment of the invention.

In the following detailed description, reference is made to the accompanying examples which form a part hereof, and in which is shown by way of illustration specific embodiments in which the invention may be practiced. These embodiments are described in sufficient detail to enable those skilled in the art to practice the invention, and it is to be understood that structural and chemical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide. The following detailed description is, therefore, not to be taken in a limiting sense, and the scope of the present invention is defined by the appended claims.

The present invention is directed to a class of energy-sensitive resist materials that are useful in lithographic processes for device fabrication. Processes for device fabrication which include lithographic steps have been described in treatises such as S. M. Sze, VLSI Technology, (McGraw-Hill pub., 1983) and L. F. Thompson et al., Introduction to Microlithography, pp. 87–161 (American Chemical Society Symposium Series 219, 1983) which are hereby incorporated by reference. Lithographic steps typically include exposing and patterning energy definable materials such as resist materials. An image is first introduced into the resist and developed to form a pattern, which is then transferred into the substrate.

The materials are energy-sensitive; i.e., energy induces a chemical change in these materials. When these materials are exposed to either patterned radiation of the appropriate wavelength, e.g., UV light with a wavelength of about 190 nm to about 370 nm, x-ray radiation or particle beams such as electron beams in direct-write lithographic processes, the chemical change is induced to a significantly greater extent in the portion of the resist material that is directly exposed to radiation than in the portion of the resist material that is not directly exposed to radiation. In the context of the present invention, significantly greater means that the chemical contrast induced by the patternwise exposure is adequate to meet processing objectives. This chemical difference is exploited to develop the pattern in the energy-sensitive resist material. The developed pattern is then used in subsequent processing, e.g., transfer of the developed pattern into an underlying substrate.

Aqueous base solutions are typically used to develop patterns in energy sensitive resist materials. One common example of an aqueous base solution is an aqueous solution of tetramethylammonium-hydroxide (TMAH) that is about 0.05 M to about 0.5 M, although many other solutions are well known to one skilled in the art.

In the positive-tone resist materials of the present invention, the material that is not exposed to radiation is relatively insoluble in the aqueous base developer solution relative to the material that is exposed to radiation. This difference in aqueous base solubility is effected either by manipulating the aqueous base solubility of the polymer in the energy sensitive material, or by manipulating the aqueous base solubility of a dissolution inhibitor in the energy-sensitive resist material.

The energy-sensitive resist materials of the present invention contain a polymer with an alicyclic moiety that is either incorporated into the polymer backbone or pendant to the polymer backbone via saturated hydrocarbon linkages. In the context of the present invention, the polymer is described in terms of the molecules, known as monomers, which undergo polymerization to form the polymer. Generally, if polymers are formed from monomers that all have the same chemical structure and composition, they are referred to as homopolymers. Polymers that are formed from two or more chemically distinct types of monomers, e.g., norbornenecarboxylic acid and maleic anhydride, are referred to herein as copolymers.

The copolymers of the present invention contain about twenty-five to about ninety-five mole percent, preferably about fifty to ninety-five mole percent, total non-imaging monomers. The non-imaging monomers comprise at least a first non-imaging monomer having a moiety that contains one or more ethylenically unsaturated bonds. The ethylenic functionality of the monomers is either contained as part of a non-cyclic hydrocarbon or as part of a cyclic hydrocarbon or pendant to these moieties.

The first non-imaging monomer is substituted with a formate group and will be referred to herein as the formate non-imaging monomer. Examples of suitable alicyclic monomers are formate esters of hydroxy derivatives of cycloolefins such as norbornene, formate esters of hydroxy derivatives of cyclodiolefins, such as 1,5-cyclooctadiene, 1,5-dimethyl-1,5-cyclooctadiene, 5,6-dihydrodicyclopentadiene, and tetracyclododecene, as well as formate esters of hydroxy derivatives of cycloacetylenes. Examples of suitable non-cyclic hydrocarbons are formate esters of 2-hydroxyethyl acrylate, and 2-hydroxyethyl methacrylate.

The polymer may also contain additional non-imaging monomer(s), which are chosen to further enhance the performance of the resist materials in lithographic processes for device fabrication. In this regard, factors such as aqueous base solubility, adhesion promotion, and the absorbance of the other monomers at the wavelength of the exposing radiation are considered in making the selection. Other factors such as the glass transition temperature ($T_g$) of the resulting polymer are also considered in selecting additional monomers. The polymer should preferably have a $T_g$ that is higher than 30 degrees Celsius, preferably higher than 50 degrees Celsius. If the $T_g$ is substantially lower than the given limit, there is a tendency for the resist to flow during subsequent processing, thereby degrading image quality.

One skilled in the art will appreciate the various factors in considering the monomers from which to form polymers which are suitable for use in the process of the present invention. Suitable additional non-imaging monomer(s) do not hinder the free radical polymerization of the first non-imaging monomer and the imaging monomer(s). The additional non-imaging monomer(s) may be present in an amount up to about fifty mole percent of the polymer, but the total amount of the non-imaging monomers, including the first formate non-imaging monomer and any additional non-imaging monomer(s), should not exceed ninety-five mole percent of the polymer.

Examples of suitable additional non-imaging monomers include maleimide monomers, and maleic anhydride monomers. Other monomers such as acrylate monomers, fumarate monomers, and acrylonitrile monomers are also contemplated as suitable if the polymerization takes place in the presence of a Lewis acid. If the polymer is to be used in an application in which the exposing radiation has a wavelength of 193 nm, it is advantageous if the additional non-imaging monomer(s) is selected so that the resulting polymer contains a lithographically insignificant amount of ethylenic unsaturation or other functionality with an absorbance that is too high at the wavelength of the exposing radiation. In the context of the present invention, "lithographically insignificant" means that the amount is not sufficient to cause adverse lithographic consequences. Maleic anhydride is an example of a monomer that is suitable for copolymerization with the alicyclic moiety to provide a polymer that is useful in lithographic processes in which the exposure wavelength is 193 nm.

The imaging monomer(s) is selected for its ability to copolymerize with the non-imaging monomer via radical polymerization, metal catalyzed polymerization, and other methods known by practitioners in the art. It is advantageous if the imaging monomer undergoes free-radical polymerization with the non-imaging monomer in a manner that incorporates the alicyclic moiety in the polymer backbone. The polymer contains about five mole percent to about seventy-five mole percent of the imaging monomer(s), preferably about five mole percent to about fifty mole percent.

Examples of suitable imaging monomers include acrylic acid, methacrylic acid, acrylates, and methacrylates, or a combination thereof The imaging monomer(s) is chosen to provide a polymer that is useful in lithographic processes. For example, an acrylic acid or acrylate monomer may advantageously lower the glass transition temperature ($T_g$) of the polymer when incorporated therein. These monomers are either substituted or unsubstituted, as is desired to provide the polymer with advantageous properties. For example, if it is desirable to decrease the solubility of the polymer in aqueous base solution, a monomer having acid labile substituents may be used. Examples of suitable pendant groups include acid labile groups such as acetal groups, ketal groups, beta-silicon substituted alkyls such as bis(trimethylsilylmethyl)methyl, bis(trimethylsilyl)ethyl and 1-(trimethylsilylmethyl)methyl, tert-butyl esters, tert-butyl esters of carboxylic acids, and tert-butyl ethers. For convenience, "tert" is shortened to "t" hereinafter. However, it is understood that a wide range of acid labile groups are operative in the invention. In the presence of the photoacid, these groups produce a free carboxylic acid and acidolysis or acid-catalyzed hydrolysis byproduct.

More than one type of imaging monomer may be used, so long as the total amount of imaging monomers in the polymer does not exceed about seventy-five mole percent, and preferably fifty mole percent. For example, a preferred polymer is the polymerization product of four monomers: the first non-imaging (alicyclic) monomer, a second non-imaging monomer (maleic anhydride), and two imaging monomers - an acrylic acid or methacrylic acid monomer, and a substituted or unsubstituted acrylate or methacrylate monomer. When selecting suitable monomers for radical polymerization, the reactivity ratios of the monomers, and the relative amount of the monomers in the feed composition for the polymerization must be taken into account. These relationships are discussed generally in Polymer Handbook, chap. II.5 (Brandrup, J. et al. eds., 2nd ed., 1989).

One example of a suitable copolymer is the polymerization product of norbornen-5-yl formate monomer with norbornene carboxylic acid. An example of the polymer is represented by the following structure:

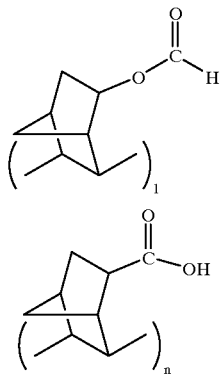

wherein l is about 0.25 to about 0.95, n is about 0.05 to about 0.75, and l+n=1. Embodiments where l is about 0.50 to about 0.95 and n is about 0.05 to about 0.50 are preferred.

Another example of a suitable copolymer is the polymerization product of a norbornen-5-yl formate monomer, a maleic anhydride monomer, and acrylic acid. An example of the polymer is represented by the following structure:

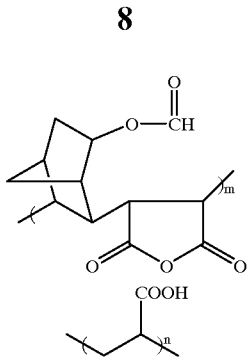

wherein m is about 0.25 to about 0.95, n is about 0.05 to about 0.75, and m+n=1. Embodiments where m is about 0.50 to about 0.95 and n is about 0.05 to about 0.50 are preferred.

A third example of a suitable copolymer is the polymerization product of a norbornen-5-yl formate monomer, a maleic anhydride monomer, acrylic acid, and t-butyl acrylate. An example of the polymer is represented by the following structure:

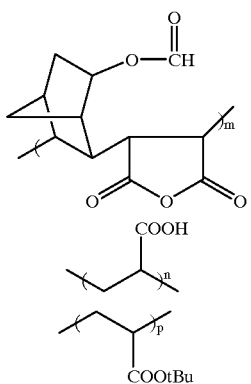

wherein m is about 0.25 to about 0.95, n+p is about 0.05 to about 0.75, and m+n+p=1. Embodiments where m is about 0.50 to about 0.95 and n+p is about 0.05 to about 0.50 are preferred.

Another example of a suitable copolymer is the copolymerization product of dicyclopentenyl formate, t-butyl norbornenecarboxylate, and norbornene carboxylic acid. An example of the copolymer is represented by the following structure:

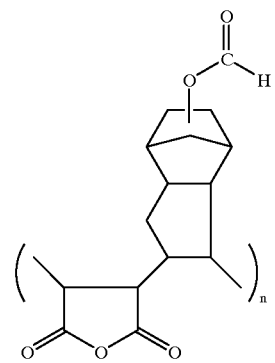

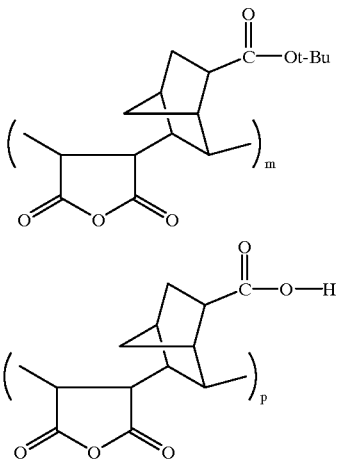

wherein n is about 0.25 to about 0.95, m+p is about 0.05 to about 0.75, and n+m+p=1. Embodiments where n is about 0.50 to about 0.95 and m+p is about 0.05 to 0.50 are preferred.

Resist materials are formed by combining the above-described polymers with other materials. In one embodiment of the present invention, the polymer, which is relatively insoluble in aqueous base solution due to the presence of the formate group of the alicyclic monomer, is combined with a photoacid generator (PAG) to form the resist material. In another embodiment, the resist material contains the polymer which is relatively insoluble in aqueous base solution, in combination with a dissolution inhibitor and a PAG. When the resist material is exposed to radiation, the photoacid generated by the PAG, typically in combination with a post-exposure bake, removes a sufficient amount of the acid cleaveable moieties present either on the resist polymer and/or on a dissolution inhibitor to render the exposed area more hydrophilic and make the formate moieties in this exposed area susceptible to rapid base hydrolysis in aqueous base solution and thus render the polymer resist soluble in aqueous base solution. Because the formate moieties do not undergo acid catalyzed hydrolysis or acidolysis in the exposed area there is less of a volume loss between exposed and unexposed areas after exposure and before development while still maintaining adequate base solubility for exposed resist areas.

In the above-described embodiments, the solubility of the resist composition in aqueous base solution is altered when the resist material is exposed to radiation. Since the resist materials of the present invention are positive resists, the aqueous base solubility of the exposed resist is greater than the aqueous base solubility of the resist that is not exposed to radiation. If the ratio of the rate of dissolution of the resist before irradiation compared to that after irradiation is taken as 1:n, n should be not be less than 2. Relative solubility ratios with values of n less than 2 typically produce low contrast and inferior image quality.

As noted above, the PAG generates an acid (the photoacid) when the resist material is exposed to radiation. Generally, the resist material is about 0.5 weight percent to about 20 weight percent (based on the weight of the resist material excluding solvent) PAG combined with the polymer. If the PAG content is above about 20 weight percent of the resist material, the optical density of the resist material may be too high and its presence above this concentration may hinder development. The amount of PAG used depends on the composition of the PAG and upon the wavelength of the exposing radiation. For example, if the resist material will be used in a lithographic process in which the wavelength of the exposing radiation is about 193 nm, and the PAG contains an aromatic moiety, the amount of PAG in the resist material is about 0.5 to about 4 weight percent, because the aromatic unsaturation in these moieties absorbs radiation at this wavelength.

The photoacid cleaves the acid labile groups from the polymer or the dissolution inhibitor, typically during a post-exposure bake. The cleavage of these acid labile groups in the resist causes the exposed formate moieties in the exposed areas to be susceptible to rapid base hydrolysis during development which makes the exposed area more soluble than the unexposed resist area. An aqueous base developer solution is then used to dissolve and remove the exposed resist material. The unexposed resist material is then used as a patterned mask for subsequent processing of the underlying substrate; typically for pattern transfer into the substrate.

Suitable PAGs include triflates (e.g. triphenysulfonium triflates, tris(t-butylphenyl)sulfonium triflate) and the corresponding salts of other perfluorinated alkyl sulfonic acids (e.g. perfluorobutanesulfonate, perfluorooctanesulfonate), other onium salts such as triarylsulfonium and diarylsulfonium hexafluoroarsenate, hexafluoroarsenate, triflate perfluoroalkylsulfonates and others, pyrogallol (e.g. trimesylate of pyrogallol), perfluoroalkylsulfonate (e.g. perfluorobutanesulfonate) and other sulfonate esters of hydroximides, a,a',-bis-sulfonyl diazomethanes, sulfonate esters of nitro-substituted benzyl alcohols and napthoquinone-4-diazides. Other suitable photoacid generators are disclosed in U.S. Pat. Nos. 5,045,432 and 5,071,730 to Allen et al., the disclosures of which are incorporated herein by reference.

The dissolution inhibitor typically has acid labile substituents which mask its aqueous base solubility, and is therefore used in conjunction with a PAG as previously described. It is envisaged that the dissolution inhibitor in addition to its acid labile group may also possess a base hydrolyzable formate moiety which will act in the same fashion as described for the formate moieties present on the polymer backbone (e.g., the tris formate ester of t-butyl cholate, the bis formate ester of t-butyl deoxycholate). The amount of dissolution inhibitor in the energy-sensitive material is about 10 to about 40 weight percent. The contrast between the portion of the resist material that is exposed to radiation and the unexposed portion is enhanced because the aqueous base solubility of both the polymer and the dissolution inhibitor is altered by the acid generated by the PAG when the resist material is exposed to radiation and subjected to a post-exposure bake.

The choice of a particular dissolution inhibitor for use in the process of the present invention depends upon the wavelength of the exposing radiation and the absorption characteristics of the particular dissolution inhibitor. In processes in which the wavelength of the exposing radiation is 248 nm, napthoquinone diazide dissolution inhibitors such as those described in Reiser, A., Photoreactive Polymers: The Science and Technology of Resists, chapters 5 and 6 (John Wiley & Sons, pub. 1989) and Dammel, R, Diazonapthoquinone-based Resists, (SPIE Optical Engineering Press 1993), which are hereby incorporated by reference, are contemplated as suitable. Diazides such as napthoquinonediazide and a pentaester of a hexahydroxyspirobifluorene with napthoquinone-2-diazide-5-sulfonic acid are examples of such dissolution inhibitors. It is advantageous if the energy-sensitive resist material is about 10 to about 35 weight percent dissolution inhibitor with a molecular weight of less than about 2000.

The napthoquinone diazide dissolution inhibitors absorb radiation at 248 nm and are even more absorbent at 193 nm. In fact, these dissolution inhibitors absorb too strongly to be incorporated into resist materials for use in processes in which the wavelength of the exposing radiation is 193 nm. Consequently, dissolution inhibitors that do not contain ethylenic saturation and are predominantly composed of alicyclic moieties are advantageous in the embodiment of the present invention in which the wavelength of the exposing radiation is 193 nm. Examples of suitable dissolution inhibitors include bile acid esters derived from cholic acid, deoxycholic acid, ursocholic acid, and lithocholic acid. The use of these dissolution inhibitors in lithographic process for device fabrication is described in U.S. Pat. No. 5,310,619 to Crivello et al. and U.S. Pat. No. 5,372,912 to Allen et al., both of which are hereby incorporated by reference.

Resist quality is significantly enhanced by selection of an appropriate optical density in the wavelength range of the exposing radiation. Too low an optical density results in inefficient absorption of the exposing radiation and in unnecessarily long exposure times. Too high an optical density does not permit sufficient light to reach the regions of the polymer film furthest removed from its ambient/resist film interface. This incomplete exposure tends to degrade resist image quality. In general, it is desirable to employ an optical density that is preferably less than 0.8 for at least 23 percent of the exposing radiation to reach the substrate at the exposure wavelength. The optical density depends on the concentration of the absorbing species in the polymer and the PAG. Thus, once a suitable thickness for the resist material coating is chosen, the resist composition is adjusted to provide the desired optical density.

Referring now to the drawings, an embodiment of the present invention for device fabrication using the energy sensitive resist material described above is illustrated by FIGS. 1 through 4. FIG. 1 depicts a substrate or wafer 20, typically a silicon wafer, being coated with a film 22 comprising the energy sensitive resist material, which is formulated as described above, dissolved in a suitable solvent, such as propylene glycol methyl ether acetate (PGME) or cyclohexanone. The film 22 can be coated on the substrate using known techniques such as spin or spray coating, or doctor blading. The thickness of the coating depends upon a variety of factors such as the absorption of the resist, the quality of the film, and the effect of thickness on image resolution. Typically, the thickness of the resist is the range of about 0.2 $\mu$m to about 2.0 $\mu$m, preferably 0.3 $\mu$m to about 1.0 $\mu$m. Thinner coatings are difficult to maintain pinhole-free, and thicker coatings generally have inferior resolution because the delineation of narrow features produces narrow columns in the developed pattern that tend to deform, and because greater absorption may occur, thereby degrading image quality.

Figure 2:
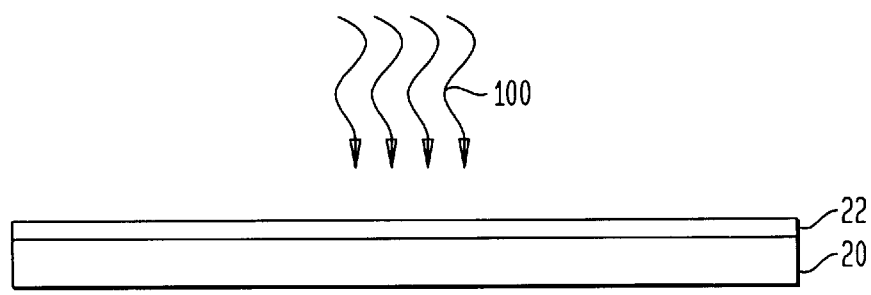
FIG. 2 shows the wafer of FIG. 1 at a processing step subsequent to that shown in FIG. 1.

After coating, the resist 22 is preferably prebaked to remove any remaining solvent. Pre-exposure baking temperatures in the range of 70° C. to 160° C. for times in the range of about 0.5 to about 60 minutes are desirable. The resist material is then patternwise exposed to energy 100 such as ultraviolet radiation with a wavelength of about 190 nm to about 370 nm, x-ray radiation, or electron beam radiation, as shown in FIG. 2. Typical doses in the range of 5 to 250 mJ/cm$^2$ for 193 nm light are contemplated as suitable. (Corresponding doses for electron beam and x-ray irradiation are contemplated). Conventional exposure techniques are employed to delineate the pattern image in the resist material 22.

The radiation is absorbed by the PAG to produce free acid in the exposed area, which then cleaves the acid labile group in the resist. It is then desirable to post-bake the resist film. This post bake enhances the reaction in the exposed area of the polymer or the dissolution inhibitor with the photoacid. Generally, post-bake temperatures in the range of 70° C. to about 170° C. for time periods of about 20 seconds to about 30 minutes are effective. Heating means such as a hot plate sold by Brewer Sciences are contemplated as useful.

Figure 3:
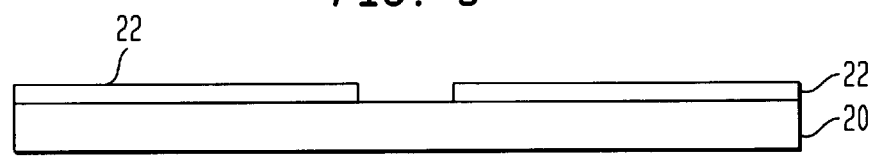
FIG. 3 shows the wafer of FIG. 1 at a processing step subsequent to that shown in FIG. 2.

Referring now to FIG. 3, the image in the resist 22 is then developed into a pattern by exploiting the difference in aqueous base solubility between the exposed resist material and the unexposed resist material. In the context of the present invention, the term "exposed resist material" implies the portion of the resist whose aqueous base solubility has been increased by exposure to the photoacid and, typically, heat. Solvents suitable for developing the exposed image are materials such as water/TMAH, water/NaOH, or mixtures of lower alkyl alcohols such as isopropanol, ethanol and methanol with or without water. Generally, immersion in the developer for time periods from 20 seconds to 5 minutes produces the desired delineation. During development the free acid moieties undergo deprotonation along with the formate moieties undergoing base hydrolysis. Both of these phenomena assist resist dissolution.

Figure 4:
FIG. 4 shows the wafer of FIG. 1 at a processing step subsequent to that shown in FIG. 3.

After development, the pattern in the resist 22 is transferred into the underlying substrate 20 using conventional etching expedients well known to one skilled in the art, as shown in FIG. 4. For example, after the substrate has been exposed, circuit patterns can be formed in the exposed areas by coating the substrate with a conductive material such as a conductive metal by known techniques such as evaporation, sputtering, plating, chemical vapor deposition or laser induced deposition. The surface of the film can be milled to remove any excess conductive material. Dielectric materials may also be deposited by similar means during the process of making circuits. Inorganic ions such as boron, phosphorus or arsenic can be implanted in the substrate to form p or n doped transistors. Other means for forming circuits are well known to those skilled in the art.

Application of the teachings of the present invention to a specific problem or environment is within the capabilities of one having ordinary skill in the art in light of the teachings contained herein. The following examples are detailed descriptions of methods of preparation and use of certain compositions of the present invention. The detailed preparations fall within the scope of, and serve to exemplify, the more generally described methods of preparation set forth above. The examples are presented for illustrative purposes only, and are not intended as a restriction on the scope of the invention.

EXAMPLE 1

Preparation of norbornen-5-yl formate

Norbornen-5-ol (25 g) was dissolved at 55° C. in 100 mL of formic acid (96%). Unless otherwise specified, all of the reagents specified in the examples herein are obtained from the Aldrich Chemical Co. After 2 hours gas chromatography (GC) indicated that all norbornen-5-ol was consumed. The reaction mixture was cooled down and 100 mL of ether was added. Then, the reaction mixture was extracted with 10×100 mL of water. The organic layer was separated, dried and ether was removed. The product was distilled at 75° C. (20 mm Hg). Yield: 17 g, 54% (95% pure by GC, no OH peak by IR). The same procedure afforded formyl ester of norbornen-5-methanol with 37% yield (b. p. 85° C., 20 mm Hg, 96% pure by GC).

EXAMPLE 2

Preparation of 5-norbornenyl-2-yl acetate, maleic anhydride, and t-butyl acrylate copolymer A vacuum flask was charged with 5-norbornenyl-2-yl acetate (25 g, 164 mmol), freshly distilled maleic anhydride (16.11 g, 164 mmol), acrylic acid (2.53 mL, 36.89 mmol), t-butyl acrylate (10.83 mL, 73.7 mmol) and 2,2'-azobisisobutyronitrile (AIBN) (0.54 g, 3.28 mmol). A minimum amount of tetrahydrofuran (THF) was added to form a homogeneous mixture at 60° C. The mixture was degassed by three freeze-pump-thaw cycles and stirred at 65° C. for 48 hours. Then, the polymerization was dissolved in 50–70 mL of acetone and precipitated into 500–700 mL of ether. The residue was collected by filtration, air dried and reprecipitated from acetone-ether two more times. The product, referred to hereinafter as polymer 1, was dried at 50° C. in a vacuum oven. Yield: 30 g, 56%.

EXAMPLE 3

Preparation of 5-norbornen-2-yl formate, maleic anhydride, and t-butyl acrylate copolymer A vacuum flask was charged with 5-norbornen-2-yl formate (17.44 g, 125 mmol), freshly distilled maleic anhydride (12.2 g, 125 mmol), t-butyl acrylate (8 mL, 71.42 mmol) and AIBN (0.34 g, 2.07 mmol). A minimum amount of THF was added to form a homogeneous mixture at 60° C. The mixture was degassed by three freeze-pump-thaw cycles and stirred at 65° C. for 48 hours. Then, the polymerization was dissolved in 50–70 mL of acetone and precipitated into 500–700 mL of ether. The residue was collected by filtration, air dried and reprecipitated from acetone-ether two more times. The product, referred to hereinafter as polymer 2, was dried at 50° C. in a vacuum oven. Yield: 17.02 g, 46%.

EXAMPLE 4

Analysis of the Dissolution Mechanisms of acetyloxy- and formyloxy-substituted Polymers in Standard Resist Developer A polymer containing norbornenyl acetate moiety (polymer 1), and a polymer containing norbornenyl formate moiety (polymer 2), were chosen for this work. Both polymers are formulated with 5 weight percent of thermal acid generator, 2-nitrobenzyl tosylate, as a 15 weight percent acetone solution. The formulations were poured into a beaker and the solvent was removed under a stream of nitrogen. Then, the beaker was placed in a convection oven at 150° C. for 5 minutes. The resulting residue was ground and dissolved in a 0.262 N aqueous solution of tetramethyl ammonium hydroxide (TMAH). As soon as dissolution was completed (about 1 minute), the mixture was neutralized with acetic acid followed by dialysis against distilled water for two days. Water was stripped off and the polymers were examined by $^1$H and $^{13}$C NMR Acetate groups of polymer 1 give rise to peaks at 1.9 ppm [$CH_3C(O)O$-protons] on $^1$H NMR spectrum or 20 ppm [$CH_3C(O)O$-carbons] and 170 ppm [$CH_3C(O)O$-carbons] on $^{13}$C NMR spectrum. If during the dissolution of polymer 1 a saponification of esters occured, peaks due to the acetate groups would decrease in intensity. Also, formation of norbornenol moiety from norbornenol ester should be accompanied by the shift of peaks due to the =CH—O— group upfield from its original position at 4.8 ppm on $^1$H NMR spectrum and at 75 ppm on $^{13}$C NMR spectrum. None of these changes, however, were detected in $^1$H and $^{13}$C NMR spectra of polymer 1 after its dissolution 0.262 N aqueous TMAH, indicating that polymer 1 did not undergo saponification of the esters, i.e., the ester group was not removed during dissolution.

After the deprotection, the NMR spectra of polymer 2 exhibits peaks at 8.2 ppm ($^1$H NMR, HC(O)O-proton) or at 174 ppm ($^{13}$C NMR, HC(O)O-carbon). After the dissolution of deprotected polymer 2 in 0.262 N aqueous TMAH both of these peaks disappear. Moreover, peaks due to the norbornenol group =CH—O— moved upfield from 74 ppm to 71 ppm on $^{13}$C NMR spectrum and from 5.1 ppm to 4.0 ppm on $^1$H NMR spectrum indicating removal of the ester group and formation of the free alcohol.

The removal of the formate group of polymer 2 and the formation of tetramethyl ammonium formate can be observed directly by dissolving the polymer 2 in a 0.262 N solution of TMAH in $D_2O$ and observing the changes by $^1$H NMR. Immediately after the dissolution, a sharp prominent peak at 8.5 ppm due to the tetramethyl ammonium formate appeared besides the broad peak at 8.2 ppm due to the norbornenyl formate unit. The reaction did not go to completion due to the small TMAH/norbornenyl formate ratio (about 5) which had to be employed in order to get good $^1$H NMR signal to noise ratio for polymer peaks. Five minutes after the beginning of the experiment, the solution was just slightly basic due to TMAH consumption.

This experiment was designed to simulate actual conditions under which a resist containing the tested polymers would be used. The polymers were formulated with thermal acid generators, exposed to heat, and then subjected to dissolution in a standard resist developer, e.g., TMAH. If the ester undergoes saponification upon dissolution, then the material has suitable characteristics for use as a resist component. This is because the ester groups will be able to assist dissolution of the resist through the deprotonation of the free acid moieties by undergoing base hydrolysis. This will effectively reduce the volume loss difference observed between exposed and non-exposed areas of the resist after bake without deleteriously affecting the dissolution characteristics of the resist. The reduction of the stress in the resist will consequently result in better imaging. In contrast, if the esters do not saponify, then the polymer is less desirable for use because the ester moiety will inhibit dissolution and lead to images of poorer quality.

It was established that during the dissolution of a polymer containing norbornenyl formate units (polymer 2) in 0.262 N aqueous TMAH, a significant saponification of the ester groups occurred. No such process was detected during dissolution of a polymer containing norbornenyl acetate units (polymer 1) in 0.262 N aqueous TMAH. Because polymer 2 undergoes saponification of the esters upon dissolution, and polymer 1 does not, polymer 2 is suitable for use in resist, but polymer 1 is less desirable.

EXAMPLE 5

Hydrolysis of dicyclopentenyl acetate, Preparation of dicyclopentenol

NaOH (20 g) in 100 mL of water was added to the mixture of DDCP-acetate (60 g) in 250 mL of methanol. The mixture was refluxed for 2 hrs and then stirred at 25° C. overnight.

EXAMPLE 6

Preparation of dicyclopentenyl-formate(3)

Dicyclopentenol (18 g) was dissolved in 50 mL of formic acid (usually it required a gentle warming). The mixture was stirred at 25° C. for 2 hrs. On cooling, saturated $NaCl_{aq}$ (50 mL) was added followed by 50 mL of hexanes. The organic layer was separated and washed with saturated NaCl (50 mL). The solvents were stripped off and the product was distilled at 110° C. (10 mmHg) yielding 19.5 g (91%) of product (95% GC pure).

EXAMPLE 7

Preparation of dicyclopentenyl formate, maleic anhydride, acrylic acid and t-butyl acrylate copolymer A vacuum flask was charged with dicyclopentenyl formate (5 g, 28.1 mmol), freshly distilled maleic anhydride (2.75 g, 28.1 mmol), acrylic acid (0.385 mL, 5.62 mmol), t-butyl acrylate (1.64 mL, 11.24 mmol) and AIBN (0.10 g, 0.61 mmol). A minimum amount of THF was added to form a homogeneous mixture at 60° C. The mixture was degassed by three freeze-pump-thaw cycles and stirred at 65° C. for 48 hrs. Then, the polymerization was dissolved in 30–50 mL of acetone and precipitated into 300–500 mL of ether. The residue was collected by filtration, air dried and reprecipitated from acetone-ether two more times. The product, referred to hereinafter as polymer 3, was dried at 50° C. in a vacuum oven. Yield: 3.15 g, 33% polymer 3.

EXAMPLE 8

Preparation of Resist Materials

The resist solutions were prepared by dissolving 13.7 weight percent solids in propylene glycol methyl ether acetate (PGMEA). These solids consisted of polymer 3 (prepared in Example 7) (63.8 wt %), bis(t-butylcholate) glutarate (29.1 wt %), t-butyl cholate (4.9 wt %), bis(t-butylphenyl)iodonium nonaflate (BPIN) (2 wt %) and triphenylimidazole (0.2 wt %). The solutions were filtered through a 0.2 μm PTFE filter prior to application to silicon substrates.

The solution was then spun at 2000–3000 RPM onto HMDS-primed silicon wafers with diameters of 6 inches. The coated wafers were baked at 140° C. for 90 seconds on a hot plate. The resist films have a thickness of about 0.51 μm. The films were then patternwise exposed to radiation at a wavelength of 193 nm using an ISI 9300i Exposure Tool. The exposure dose varied systematically from about 10 to 30 $mj/cm^2$. The resolution dose was determined to be about 22.55 $mJ/cm^2$. The exposure was done through a mask having a standard resolution pattern containing a series of equal lines and spaces that varied from 0.155 microns to 0.2 microns.

The exposed films are then baked at 155° C. for two minutes. The patterns are then developed in an aqueous base solution (0.262 N solution of TMAH) for about 25 seconds. The developed resist defines features as small as 0.155 μm.

EXAMPLE 9

Preparation of dicyclopentenyl formate, maleic anhydride, norbornene carboxylic acid and t-butyl norbornene carboxylate copolymer A vacuum flask was charged with dicyclopentenyl formate (5 g, 28.1 mmol), freshly distilled maleic anhydride (4.48 g, 45.7 mmol), norbornene carboxylic acid (0.775 g, 5.62 mmol), t-butyl norbornene carboxylate (2.4 g, 12 mmol) and AIBN (0.30 g, 1.83 mmol). A minimum amount of THF was added to form a homogeneous mixture at 60° C. The mixture was degassed by three freeze-pump-thaw cycles and stirred at 65° C. for 48 hrs. Then, the polymerization was dissolved in 30–50 mL of acetone and precipitated into 300–500 mL of ether. The residue was collected by filtration, air dried and reprecipitated from acetone-ether two more times. The product, referred to hereinafter as polymer 4, was dried at 50° C. in a vacuum oven. Yield: 5.38 g, 43% polymer 4.

EXAMPLE 10

Preparation of Resist Materials

The resist solutions were prepared by dissolving 13.7 wt % solids in PGMEA. These solids consisted of polymer 4 (prepared in Example 9) (63.8 wt %), bis(t-butylcholate) glutarate (29.1 wt %), t-butyl cholate (4.9 wt %), BPIN (2 wt %) and triphenylimidazole (0.2 wt %). The solutions were filtered through a 0.2 μm PTFE filter prior to application to silicon substrates.

The solution was then spun at 2000–3000 RPM onto HMDS-primed silicon wafers with diameters of 6 inches. The coated wafers were baked at 140° C. for 90 seconds on a hot plate. The resist films have a thickness of about 0.51 pm. The films were then patternwise exposed to radiation at a wavelength of 193 nm using an ISI 9300i Exposure Tool. The exposure dose varied systematically from about 10 to 30 $mJ/cm^2$. The resolution dose was determined to be about 26.1 $mJ/cm^2$. The exposure was done through a mask having a standard resolution pattern containing a series of equal lines and spaces that varied from 0.145 microns to 0.2 microns.

The exposed films were then baked at 155° C. for two minutes. The patterns were then developed in an aqueous base solution (0.262 N solution of TMAH) for about 25 seconds. The developed resist defines features as small as 0.145 μm.

The above description, drawings and examples are only illustrative of preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A process for device fabrication comprising the steps of:

forming a layer of an energy sensitive resist material on a substrate, wherein the energy sensitive resist material comprises a radiation sensitive material and a polymer which is the polymerization product of about 5 to about 75 mole percent imaging monomers and about 25 to about 95 mole percent of non-imaging monomers, wherein said non-imaging monomers comprise a formate non-imaging monomer;

exposing the layer of energy sensitive resist material to patterned radiation thereby introducing an image of the pattern into the resist material;

developing the image into a pattern; and transferring the pattern into the underlying substrate.

2. The process of claim 1, wherein the imaging monomers comprise monomers selected from the group consisting of acrylic acid, methacrylic acid, acrylates, and methacrylates.

3. The process of claim 2, wherein the imaging monomers further comprise t-butyl acrylate.

4. The process of claim 1, wherein the imaging monomers comprise acrylic acid.

5. The process of claim 1, wherein the imaging monomers comprise alicyclic monomers having acid labile substituents, free acid substituents, or both acid labile and free acid substituents.

6. The process of claim 5, wherein the acid labile substituents are selected from the group consisting of acetal groups, ketal groups, beta-silicon substituted alkyls, t-butyl esters, t-butyl esters of carboxylic acids, and t-butyl ethers.

7. The process of claim 5, wherein the imaging monomers comprise t-butyl esters of norbornene carboxylate.

8. The process of claim 1, wherein the formate non-imaging monomer has a formyl-substituted alicyclic hydrocarbon moiety that is either incorporated into the polymer backbone or pendent to the polymer backbone.

9. The process of claim 8, wherein the alicyclic hydrocarbon moiety is selected from the group consisting of cycloolefins, cyclodiolefins, and cycloacetylenes.

10. The process of claim 8, wherein the alicyclic hydrocarbon moiety is selected from the group consisting of 1,5-dimethyl-1,5-cyclooctadiene, 5,6-dihydrodicyclopentadiene, 1,5-cyclooctadiene, and tetracyclododecene.

11. The process of claim 1, wherein the formate non-imaging monomer is selected from the group consisting of norbornenyl formate and dicyclopentenyl formate.

12. The process of claim 1, wherein the non-imaging monomers further comprise maleic anhydride.

13. The process of claim 1, wherein the exposing radiation is ultraviolet radiation with a wavelength of about 190 to about 300 nm.

14. An energy sensitive resist material comprising:
a radiation sensitive material; and
a polymer which is the polymerization product of about 5 to about 75 mole percent imaging monomers, and about 25 to about 95 mole percent of non-imaging monomers, wherein said non-imaging monomers comprise a formate non-imaging monomer.

15. The energy sensitive resist material of claim 14, wherein the imaging monomers comprise monomers selected from the group consisting of acrylic acid, methacrylic acid, acrylates, and methacrylates.

16. The energy sensitive resist material of claim 14, wherein the imaging monomers comprise monomers selected from the group consisting of norbornene carboxylic acid, t-butyl norbornene carboxylate, and acrylic acid.

17. The energy sensitive resist material of claim 16, wherein the imaging monomers further comprise t-butyl norbornene carboxylate.

18. The energy sensitive resist material of claim 14, wherein the formate non-imaging monomer has a formyl-substituted alicyclic hydrocarbon moiety that is selected from the group consisting of 1,5-dimethyl-1,5-cyclooctadiene, 5,6-dihydrodicyclopentadiene, 1,5-cyclooctadiene, norbornene, dicyclopentenol, and cycloacetylenes.

19. The energy sensitive resist material of claim 14, wherein the non-imaging monomers further comprise an additional non-imaging monomer present in an amount up to about 50 mole percent of the polymer.

20. The energy sensitive resist material of claim 19, wherein the additional non-imaging monomer is selected from the group consisting of maleimides, maleic anhydrides, acrylates, fumarates, and acrylonitriles.

21. The energy sensitive resist material of claim 14, wherein the imaging monomers are present in an amount of about 5 to about 50 mole percent of said polymer, and the non-imaging monomers are present in an amount of about 50 to about 95 mole percent of said polymer.

22. The energy sensitive resist material of claim 14, further comprising a dissolution inhibitor, wherein the amount of the radiation sensitive material is about 0.5 to about 20 weight percent of the energy sensitive resist material and the amount of dissolution inhibitor in the energy sensitive resist material is about 10 to about 40 weight percent.

23. The energy sensitive resist material of claim 14, wherein the imaging monomers comprise norbornene carboxylic acid and the formate non-imaging monomer comprises norbornenyl formate.

24. The energy sensitive resist material of claim 23, wherein the imaging monomers further comprise t-butyl norbornene carboxylate.

25. The energy sensitive resist material of claim 23, wherein the non-imaging monomers further comprise maleic anhydride.

26. The energy sensitive resist material of claim 14, wherein the imaging monomers comprise acrylic acid, the formate non-imaging monomer comprises norbornenyl formate, and the non-imaging monomers further comprise maleic anhydride.

27. The energy sensitive resist material of claim 14, wherein the imaging monomers comprise t-butyl norbornene carboxylate and the formate non-imaging monomer comprises dicyclopentenyl formate.

28. An energy sensitive resist material comprising:
a radiation sensitive material; and
a polymer which is the polymerization product of about 5 to about 50 mole percent imaging monomers, and about 25 to about 95 mole percent of non-imaging monomers, wherein said non-imaging monomers comprise a formate non-imaging monomer, and an additional non-imaging monomer selected from the group consisting of maleimides, maleic anhydrides, acrylates, fumarates, and acrylonitriles, wherein said additional non-imaging monomer is present in an amount up to about 50 mole percent of the polymer.

29. The energy sensitive resist material of claim 28, wherein the imaging monomers are selected from the group consisting of acrylic acid, methacrylic acid, acrylates and methacrylates.

30. The energy sensitive resist material of claim 28, wherein the imaging monomers are selected from the group consisting of norbornene carboxylic acid, and t-butyl norbornene carboxylate.

31. The energy sensitive resist material of claim 28, wherein the formate non-imaging monomer is norbornenyl formate.

32. The energy sensitive resist material of claim 28, wherein the formate non-imaging monomer is dicyclopentenyl formate.

33. The energy sensitive resist material of claim 28, wherein the formate non-imaging monomer is selected from the group consisting of formate esters of hydroxy derivatives of cycloacetylenes, formate esters of hydroxy derivatives of cycloolefins, and formate esters of hydroxy derivatives of cyclodiolefins.

34. The energy sensitive resist material of claim 28, wherein the imaging monomers are present in an amount of about 5 to about 50 mole percent of said polymer, and the non-imaging monomers are present in an amount of about 50 to about 95 mole percent of said polymer.

35. The energy sensitive resist material of claim 28, further comprising a dissolution inhibitor, wherein the amount of the radiation sensitive material is about 0.5 to about 20 weight percent of the energy sensitive resist material and the amount of dissolution inhibitor in the energy sensitive resist material is about 10 to about 40 weight percent.

36. The energy sensitive resist material of claim 28, wherein the imaging monomers comprise norbornene carboxylic acid and t-butyl norbornene carboxylate, the formate non-imaging monomer is norbornenyl formate and the additional non-imaging monomer is maleic anhydride.

37. The energy sensitive resist material of claim 28, wherein the imaging monomers comprise norbornene carboxylic acid and t-butyl norbornene carboxylate, the formate non-imaging monomer is norbornenyl formate and the additional non-imaging monomer is maleic anhydride.

38. An energy sensitive resist material comprising:
   a radiation sensitive material;
   a dissolution inhibitor; and
   a polymer which is the polymerization product of about 5 to about 50 mole percent imaging monomers, and about 50 to about 95 mole percent of non-imaging monomers, wherein said non-imaging monomers comprise a formate non-imaging monomer and an additional non-imaging monomer present in an amount up to about 50 mole percent of the polymer.

39. The energy sensitive resist material of claim 38, wherein the imaging monomers are selected from the group consisting of norbornene carboxylic acid, and t-butyl norbornene carboxylate.

40. The energy sensitive resist material of claim 38, wherein the formate non-imaging monomer is selected from the group consisting of formate esters of hydroxy derivatives of cycloolefins, formate esters of hydroxy derivatives of cyclodiolefins, and formate esters of hydroxy derivatives of cycloacetylenes.

41. The energy sensitive resist material of claim 38, wherein the additional non-imaging monomer is selected from the group consisting of maleimides, maleic anhydrides, acrylates, fumarates, and acrylonitriles.

42. The energy sensitive resist material of claim 38, wherein the formate non-imaging monomer is norbornenyl formate, and the additional non-imaging monomer is maleic anhydride.

43. The energy sensitive resist material of claim 42, wherein the imaging monomers comprise norbornene carboxylic acid.

44. The energy sensitive resist material of claim 42, wherein the imaging monomers comprise acrylic acid.

* * * * *